(12) United States Patent
Amos et al.

(10) Patent No.: US 6,846,734 B2
(45) Date of Patent: Jan. 25, 2005

(54) METHOD AND PROCESS TO MAKE MULTIPLE-THRESHOLD METAL GATES CMOS TECHNOLOGY

(75) Inventors: Ricky Amos, Rhinebeck, NY (US); Katayun Barmak, White Plains, NY (US); Diane C. Boyd, Langrangeville, NY (US); Cyril Cabral, Jr., Ossining, NY (US); Meikei Leong, Wappingers Falls, NY (US); Thomas S. Kanarsky, Hopewell Junction, NY (US); Jakub Tadeusz Kedzierski, Peekskill, NY (US)

(73) Assignee: International Business Machines Corporation, Armonk, NY (US)

( * ) Notice: Subject to any disclaimer, the term of this patent is extended or adjusted under 35 U.S.C. 154(b) by 59 days.

(21) Appl. No.: 10/300,165

(22) Filed: Nov. 20, 2002

(65) Prior Publication Data

US 2004/0094804 A1 May 20, 2004

(51) Int. Cl.[7] ................ H01L 21/3205; H01L 21/8238; H01L 21/4763; H01L 21/44
(52) U.S. Cl. ................ 438/592; 438/199; 438/587; 438/588; 438/652; 438/655; 438/649; 438/651; 438/664
(58) Field of Search ................ 257/369, 413, 257/407, 347, 402, 350, 412; 438/199, 652, 217, 647, 289, 655, 585, 642, 587, 649, 588, 651, 592, 149, 664, 479, 517, 153, 154

(56) References Cited

U.S. PATENT DOCUMENTS

| | | |
|---|---|---|
| 6,190,952 B1 | 2/2001 | Xiang et al. |
| 6,204,103 B1 | 3/2001 | Bai et al. |
| 6,235,568 B1 | 5/2001 | Murthy et al. |
| 6,238,982 B1 | 5/2001 | Krivokapic et al. |
| 6,251,777 B1 | 6/2001 | Jeng et al. |
| 6,262,456 B1 | 7/2001 | Yu et al. |
| 6,281,117 B1 | 8/2001 | Chan et al. |
| 6,281,559 B1 | 8/2001 | Yu et al. |
| 2002/0045344 A1 | 4/2002 | Wang et al. |

OTHER PUBLICATIONS

B Tavel, et al., "Totally Silicided (CoSi2) Polysilicon: a novel approach to very low–resistive gate (~2O/?) without metal CMP nor etching", France Telecom R&D, B.P. 98,38243, Meylan, France, STMicroelectronics F–38926, Crolles Cedex, France, IEDM 01–825, 2001 IEEE, pp. 37.5.1–37.5.4.

M. Qin, et al., "Investigation of Polycrystalline Nickel Silicide Films as a Gate Material", Journal of The Electrochemical Society, 148 (5) pp G271–G274, 2001.

J. Kedzierski, et al., "Metal–gate FinFET and fully–depleted SOI devices using total gate silicidation", IBM Semiconductor Research and Development Center (SRDC), Research Division, Yorktown Heights, NY, ★Microelectronics Division, Hopewell Junction, NY, ★★Microelectronics Division, Essex Junction, VT.

*Primary Examiner*—Steven Loke
(74) *Attorney, Agent, or Firm*—Scully, Scott, Murphy & Presser; Robert M. Trepp, Esq.

(57) ABSTRACT

Methods of forming complementary metal oxide semiconductor (CMOS) devices having multiple-threshold voltages which are easily tunable are provided. Total salicidation with a metal bilayer (representative of the first method of the present invention) or metal alloy (representative of the second method of the present invention) is provided. CMOS devices having multiple-threshold voltages provided by the present methods are also described.

27 Claims, 9 Drawing Sheets

US 6,846,734 B2

METHOD AND PROCESS TO MAKE MULTIPLE-THRESHOLD METAL GATES CMOS TECHNOLOGY

FIELD OF THE INVENTION

The present invention relates to semiconductor devices, and more particularly to methods for forming complementary metal oxide semiconductor (CMOS) devices which include metal gates having multiple-threshold voltages Vt associated therewith.

BACKGROUND OF THE INVENTION

In current metal oxide semiconductor field effect transistors (MOSFETs), a polysilicon gate is typically employed. One disadvantage of utilizing polysilicon gates is that at inversion, the polysilicon gates generally experience depletion of carriers in the area of the polysilicon gate that is adjacent to the gate dielectric. This depletion of carriers is referred to in the art as the polysilicon depletion effect. The depletion effect reduces the effective gate capacitance of the MOSFET. Ideally, it is desirable that the gate capacitance of the MOSFET be high since high gate capacitance typically equates to more charge being accumulated. As more charge is accumulated in the channel, the source/drain current becomes higher when the transistor is biased.

MOSFETs including a gate stack comprising a bottom polysilicon portion and a top silicide portion are also known. The layer of silicide in such a gate stack contributes to a decrease in the resistance of the gate. The decrease in resistance causes a decrease in the time propagation delay RC of the gate. Although a silicide top gate region may help decrease the resistance of the transistor, charge is still depleted in the vicinity of the interface formed between the bottom polysilicon gate and gate dielectric, thereby causing a smaller effective gate capacitance.

Another type of MOSFET that is available is one where the gate electrode is made entirely of a metal. In such MOSFETs, the metal of the gate prevents depletion of charge through the gate. This prevents the increase in effective thickness of the gate capacitor and the capacitance decreases as a result of the depletion effect.

Although metal gates can be used to eliminate the poly-depletion effect and to provide lower gate resistance, it is generally quite difficult to offer multiple-threshold voltages with metal gates. Multiple-threshold voltages are needed in the semiconductor industry in order to provide design flexibility for low-power, high-performance, and mixed-signal applications for overall system performance.

U.S. Pat. No. 6,204,103 to Bai, et al. disclose a method for forming first and second transistor devices. This prior art method includes the steps of forming a first region of silicide over a portion of a gate dielectric that overlies a first well region in a semiconductor substrate; forming a second region of silicide over a second portion of the gate dielectric that overlies a second well region in the substrate; and forming first and second doped regions in the first and second well regions.

In Bai, et al., different metals are employed in forming the first and second silicide regions. The prior art does not disclose the use of a bimetal layer in forming one of the silicide regions, nor does it disclose a process where metal alloys are used. Bai, et al. does make a general statement, See Col. 5, lines 22–24, that "metals may exist at a desired Fermi level in their natural state or by chemical reactions such as alloying, doping, etc." No disclosure of using metal alloys in this prior art process is however made.

In current CMOS technology, impurity doping into the body of the MOSFET via ion implantation is employed for short-channel effect control and threshold voltage tuning. However, carrier mobility is degraded with ever increasing impurity doping which, in turn, degrades the device performance. The threshold voltage variations due to doping fluctuation will also limit the effectiveness of the doping technique. It is therefore highly desirable to provide an alternative way to adjust the threshold voltage in metal gated MOSFETs.

SUMMARY OF THE INVENTION

The present invention provides methods for adjusting the threshold voltage of MOSFETs which do not involve body doping, thus providing CMOS devices having multiple-threshold voltages. In the present invention, total salicidation with a metal bilayer (representative of the first method of the present invention) or metal alloy (representative of the second method of the present invention) is employed to tune the threshold voltage of the MOSFETs.

Specifically, the first method of the present invention comprises the steps of:

providing a structure which comprises a plurality of patterned gate regions located atop a Si-containing layer, each of said patterned gate regions including at least a patterned polysilicon region;

forming a first metal on a first predetermined number of said patterned gate stack regions, said first metal is in contact with said patterned polysilicon region;

forming a second metal on said first metal as well as a second predetermined number of said patterned gate stacks, wherein said second metal in said second predetermined number of said patterned gate stacks is in contact with said patterned polysilicon region; and annealing so as to cause reaction between the first and second metals and underlying silicon regions and subsequent formation of silicide regions, where said first predetermined number of patterned gate stack regions comprises an alloy silicide of the first and second metals and said second predetermined number of patterned gate stack regions comprises a silicide of said second metal.

Another method of the present invention which includes a metal bilayer to tune the threshold voltage comprises the steps of:

providing a structure which comprises a plurality of patterned gate regions located atop a Si-containing layer, each of said patterned gate regions including at least a patterned polysilicon region;

forming a first metal on a first predetermined number of said patterned gate stack regions, said first metal is in contact with said patterned polysilicon region;

annealing said first metal to provide a first metal silicide in said first predetermined number of patterned gate stack regions;

forming a second metal atop the first metal silicide as well as on a second predetermined number of patterned gate stack regions, said second metal in said second predetermined number of patterned gate stack regions is in contact with said patterned polysilicon region; and annealing said second metal to form a second metal silicide region, wherein said first predetermined number of patterned gate stacks comprising at least an alloy silicide of said first and second metals, and said second predetermined number of patterned gate stacks comprises said second metal silicide region.

A second method of the present invention, which includes a metal alloy layer to tune the threshold voltage of the MOSFET device, comprises the steps of:

providing a structure which comprises a plurality of patterned gate regions located atop a Si-containing layer, each of said patterned gate regions including at least a patterned polysilicon region;

forming a dielectric stack on exposed surfaces of said Si-containing layer, said dielectric stack having an upper surface that is coplanar with said patterned polysilicon region;

forming a metal alloy layer atop said upper surface of said dielectric stack and an exposed surface of said patterned polysilicon region, said metal alloy layer comprising a metal and at least one alloying additive;

forming a capping layer atop said metal alloy layer;

first annealing to form a partial silicide region in an upper portion of said patterned gate stack regions;

selectively removing said capping layer; and second annealing to convert remaining portions of said patterned gate stack region and said partial silicide regions into a metal alloy silicide region.

Another aspect of the present invention relates to a CMOS device which comprises: a Si-containing layer having source/drain regions present therein; a gate dielectric present atop portions of said Si-containing layer; and at least one alloy silicide metal gate located atop said gate dielectric, said alloy silicide metal gate is comprised of a metal bilayer or a metal alloy layer.

DETAILED DESCRIPTION OF THE INVENTION

Figure 1:
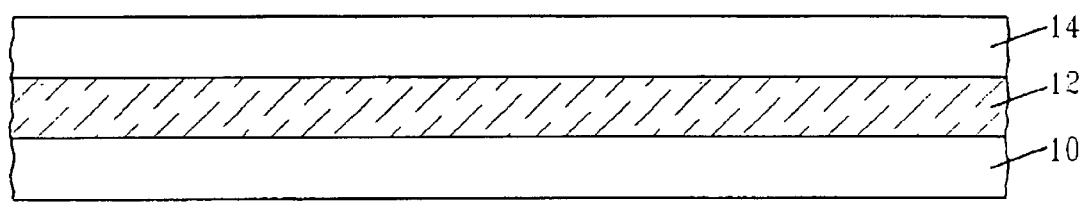
FIGS. 1–9 are pictorial representations (through cross sectional views) showing the basic processing steps that are employed in the first method of the present invention.

The present invention, which provides methods for fabricating metal-gated CMOS devices with multiple-threshold voltages, will now be described in more detail by referring to the drawings that accompany the present application.

The first method of the present invention, which is illustrated in FIGS. 1–9, and FIGS. 10A–10C will now be described. In the first method of the present invention, a metal bilayer is used to tailor the threshold voltage of the CMOS device.

Reference is first made to FIG. 1 which illustrates an initial silicon-on-insulator (SOI) wafer that can be employed in the present invention. Specifically, the initial SOI wafer of FIG. 1 comprises buried oxide layer 12 sandwiched between Si-containing substrate 10 and Si-containing layer 14. The buried oxide layer electrically isolates Si-containing substrate 10 from Si-containing layer 14. It is noted that Si-containing layer 14 is the region of the SOI wafer in which active devices are typically formed. The term "Si-containing" as used herein denotes a material that includes at least silicon. Illustrative examples of such Si-containing material include, but are not limited to: Si, SiGe, SiC, SiGeC, Si/Si, Si/SiC, and Si/SiGeC. Buried oxide region 12 may be a continuous buried oxide region, as is shown in FIG. 1, or it may be a non-continuous, i.e., patterned, buried oxide region (not shown). The non-continuous buried oxide regions are discrete and isolated regions or islands that are surrounded by Si-containing layers, i.e., Si-containing layers 10 and 14.

The SOI wafer may be formed utilizing conventional SIMOX (separation by ion implantation of oxygen) processes well known to those skilled in the art. In a typically SIMOX process, oxygen ions are implanted into a Si wafer utilizing ion implantation. The depth of the implant region is dependent on the conditions used during ion implantation. After the implant step, the implanted wafer is subjected to an annealing step which is capable of converting the implanted region into a buried oxide region. Alternatively, the SOI wafer may be made using other conventional processes including, for example, a thermal bonding and cutting process.

In addition to the above techniques, the initial SOI wafer employed in the present invention may be formed by deposition processes as well as lithography and etching (employed when fabricating a patterned SOI substrate). Specifically, the initial SOI wafer may be formed by depositing or thermally growing an oxide film atop a Si-containing substrate; optionally patterning the oxide film by conventional lithography and etching; and thereafter forming a Si-containing layer atop the oxide layer using a conventional deposition process, including, for example, chemical vapor deposition (CVD), plasma-assisted CVD, sputtering, evaporation, chemical solution deposition or epitaxial Si growth.

The thickness of the various layers of the initial SOI wafer may vary depending on the process used in making the same. Typically however, Si-containing layer 14 has a thickness of from about 5 to about 200 nm, preferably 10 to 20 nm. In the case of the buried oxide layer, that layer may have a thickness of from about 100 to about 400 nm. The thickness of the Si-containing substrate layer, i.e., layer 10, is inconsequential to the present invention. It is noted that the thicknesses provided above are exemplary and by no ways limit the scope of the present invention.

In the present invention, portions of Si-containing layer 14 will serve as the body region of a metal-gated CMOS device. Note that Si-containing layer 14 may be undoped or it can be doped utilizing conventional techniques well known to those skilled in the art. The type of doping is dependent on the type of device to be fabricated. In the drawings of the first method of the present invention that follows, the Si-containing substrate is not shown for clarity. Nevertheless, Si-containing substrate 10 is meant to be included in FIGS. 2–9 and 10A–10C.

Figure 2:
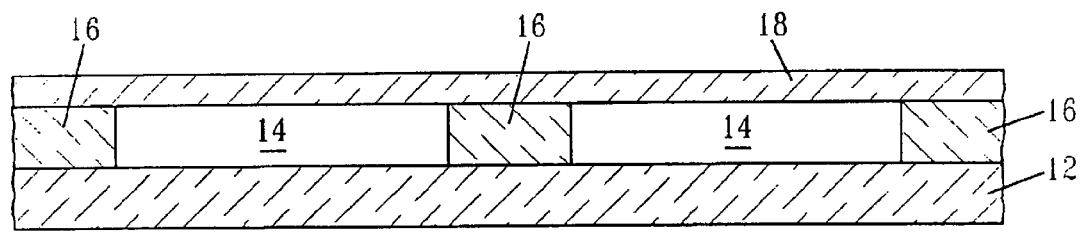

FIG. 2 shows the SOI wafer after trench isolation regions 16 and gate dielectric 18 have been formed. The trench isolation regions are fabricated by first forming a sacrificial oxide (not shown) and a hardmask (not shown) on the surface of the SOI wafer and thereafter forming trenches into predetermined portions of the SOI wafer such that the bottom wall of each trench stops either in Si-containing layer 14 or on a top surface of buried oxide layer 12. The sacrificial oxide layer may be formed by a thermal oxidation process or by a conventional deposition process such as CVD. The hardmask is formed via deposition atop the previously formed sacrificial oxide layer. The hardmask is composed of an insulating material which has a different etch selectivity as compared to the sacrificial oxide layer. Typically, the hardmask is composed of a nitride or oxynitride.

Trenches are then formed through the hardmask and sacrificial oxide layer into the SOI wafer utilizing conventional lithography and etching. The lithography step used in forming the trenches comprises the steps of: applying a photoresist (not shown) to the top surface of the structure, exposing the photoresist to a pattern of radiation, and developing the pattern into the exposed photoresist utilizing a conventional resist developer. The etching step, which may be conducted in a single step or multiple etching steps, includes the use of a conventional dry etching process such as reactive ion etching (RIE), plasma etching, ion beam etching; chemical etching; or a combination thereof. In forming the trenches, the pattern formed in the resist is transferred to the hardmask via etching and then the patterned photoresist is removed. Further etching is employed in transferring the trench pattern from the hardmask into the SOI wafer.

The SOI wafer containing trenches is then subjected to an optional oxidation process which forms a thin oxide liner (not specifically labeled) on the exposed trench sidewalls that are composed of a Si-containing material. The trenches (without or without the liner) are filled with a dielectric (or insulating material) such as TEOS (tetraethylorthosilicate) utilizing a conventional deposition process such as CVD or plasma-CVD. Thereafter, the structure is planarized using a conventional planarization process such as chemical-mechanical polishing (CMP) or grinding, stopping on the upper surface of the hardmask. An optional densification step may be performed after filling the trenches, but prior to planarization.

The remaining hardmask is then removed utilizing an etching process that is highly selective in removing nitride as compared with oxide and thereafter the remaining sacrificial oxide layer as well as nub portions of the filled trenches are removed utilizing an etching process that is highly selective in removing oxide as compared to Si-containing material. Note that after the sacrificial oxide has been removed, surface portions of Si-containing layer 14 are now bare.

Gate dielectric 18 is then formed atop the bare Si-containing surfaces as well as the trench isolation regions utilizing a conventional thermal growing process or by deposition. The gate dielectric is typically a thin layer having a thickness of from about 1 to about 10 nm. The gate dielectric may be composed of an oxide including, but not limited to: $SiO_2$, oxynitides, $Al_2O_3$, $ZrO_2$, $HfO_2$, $Ta_2O_3$, $TiO_2$, perovskite-type oxides, silicates and combinations of the above with or without the addition of nitrogen.

Figure 3:
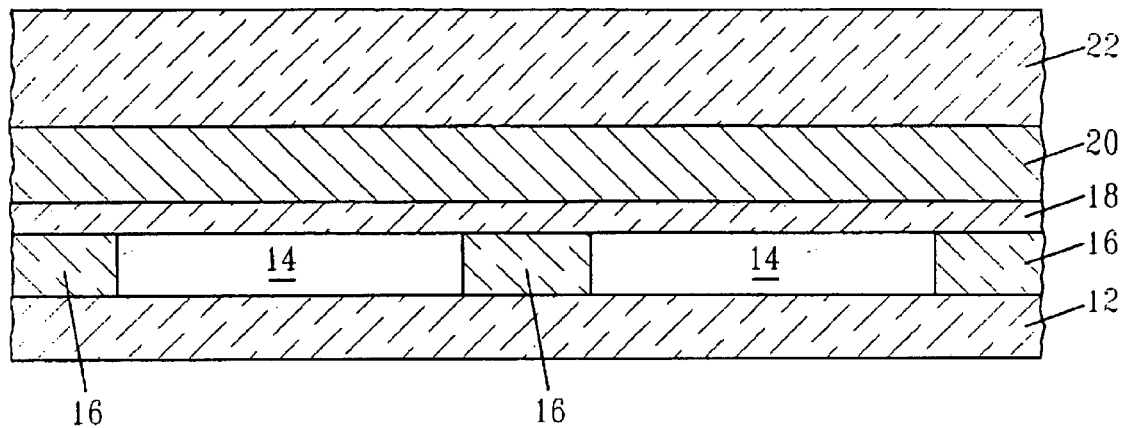

After forming the gate dielectric on the exposed surface of the structure, polysilicon layer 20 and oxide layer 22 are then formed so as to provide the structure illustrated in FIG. 3. The polysilicon layer is formed utilizing a conventional deposition process such as CVD. The thickness of polysilicon layer 20 may vary, but typically polysilicon layer 20 has a thickness of from about 40 to about 200 nm. The oxide layer is formed by a conventional deposition process or a thermal growing process atop the previously formed polysilicon layer. The thickness of oxide layer 22 may vary, but typically oxide layer 22 has a thickness of from about 20 to about 200 nm. Note that polysilicon layer 20 and oxide layer 22 are used in defining the gate region of the present invention.

Figure 4:
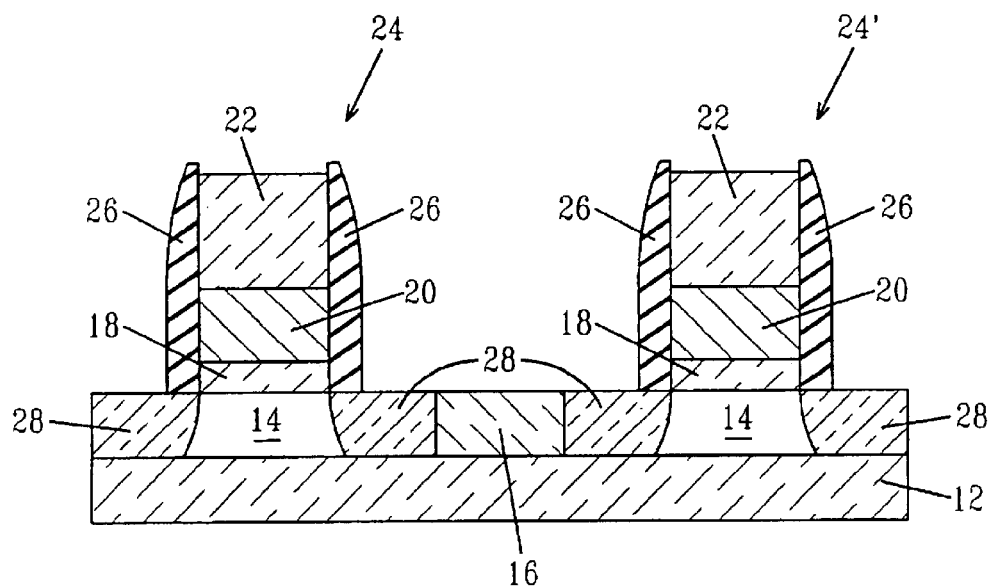
Figure 5:
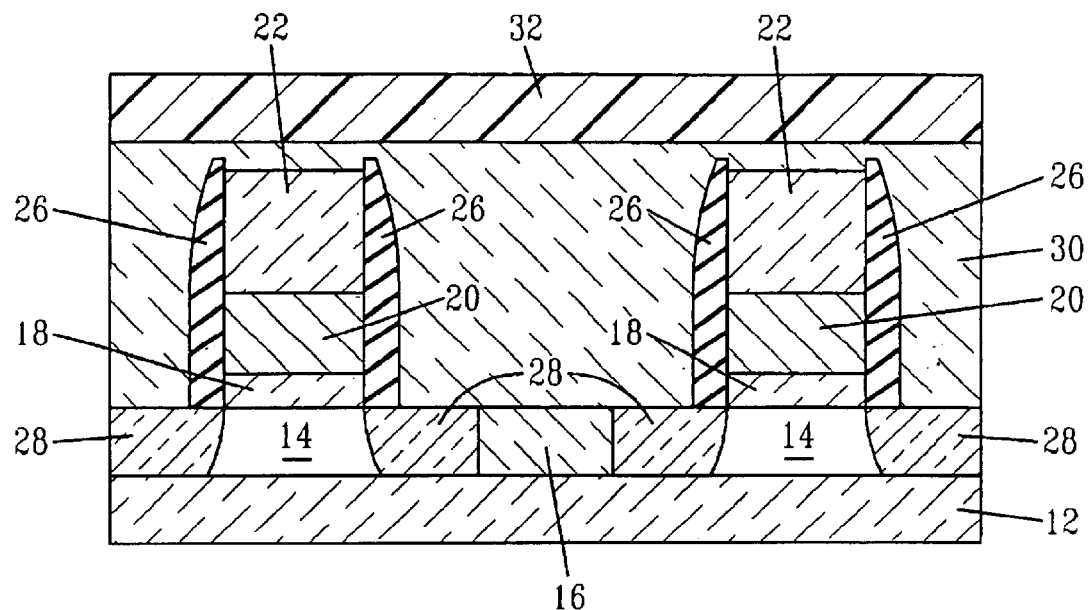

Gate patterning of oxide layer 22, polysilicon layer 20 and gate dielectric 18 is then performed utilizing conventional lithography and etching so as to provide a plurarity of patterned stack regions atop the SOI wafer. FIG. 4 shows the formation of two patterned stack regions labeled as 24 and 24'. Insulating spacers 26 are then formed on each exposed vertical sidewall surface of the patterned stack regions by first depositing an insulating material, such as a nitride or oxynitride, and then selectively etching the insulator material.

Following spacer deposition and etching, source/drain regions 28 are formed into Si-containing layer 14 by utilizing conventional ion implantation followed by activation annealing. FIG. 4 shows the structure after the above processing steps have been performed.

Barrier layer 30 composed of an oxide or other like barrier material is then formed by conventional deposition techniques on top as well as abutting the patterned stack regions. Resist 32 is then formed via a deposition process such as spin-on coating or CVD atop barrier layer 30. The resultant structure, including barrier layer 30 and resist 32 is shown, for example, in FIG. 5.

Figure 6:
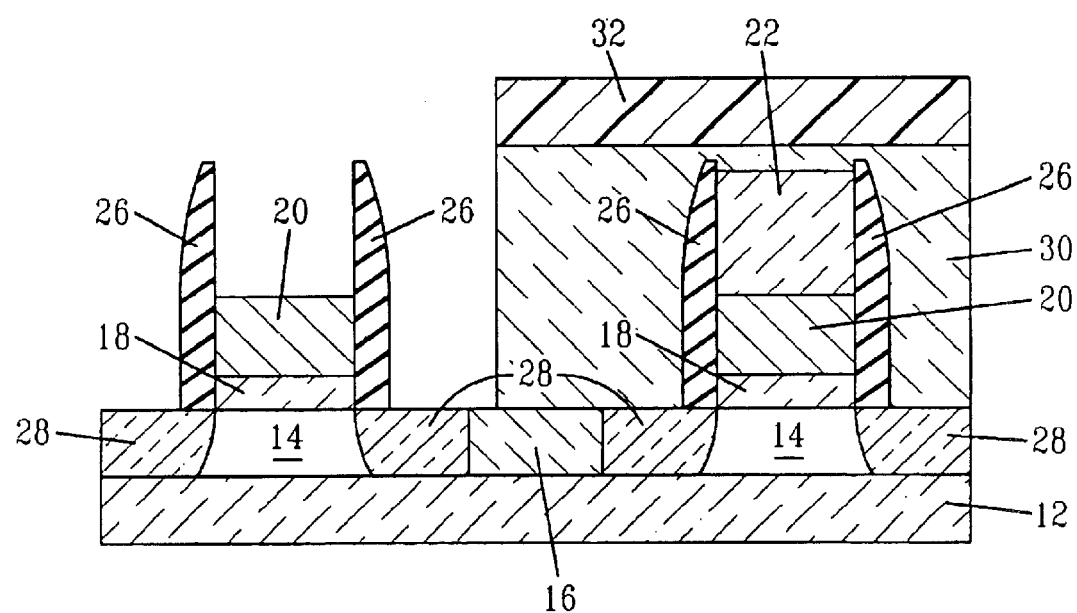
Figure 7:
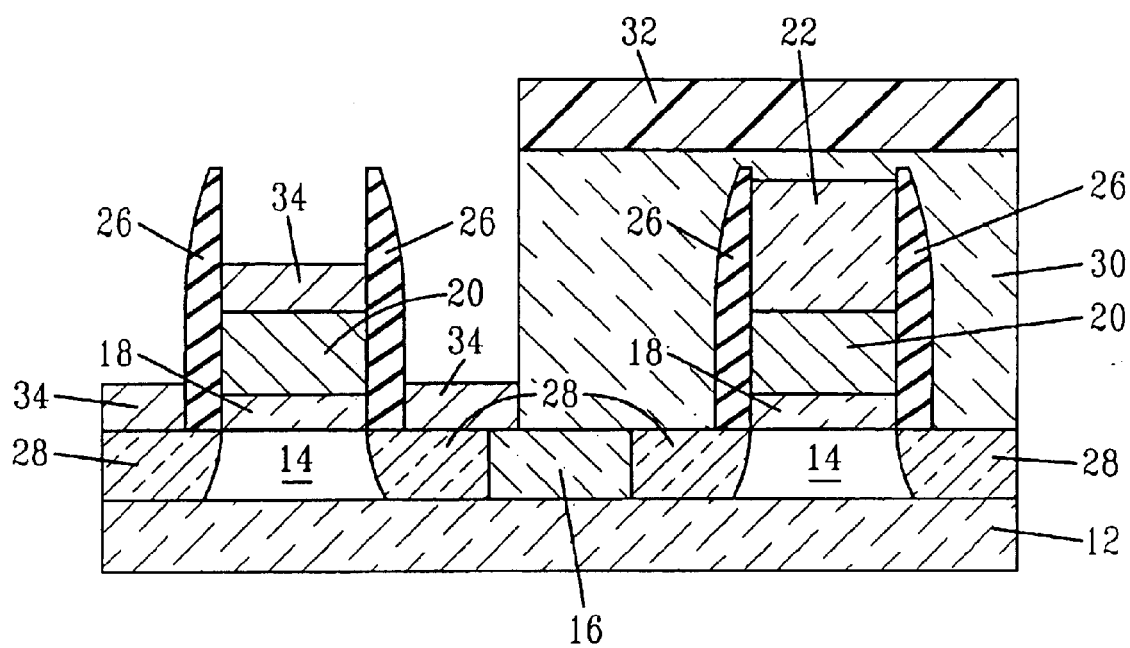
Figure 8:
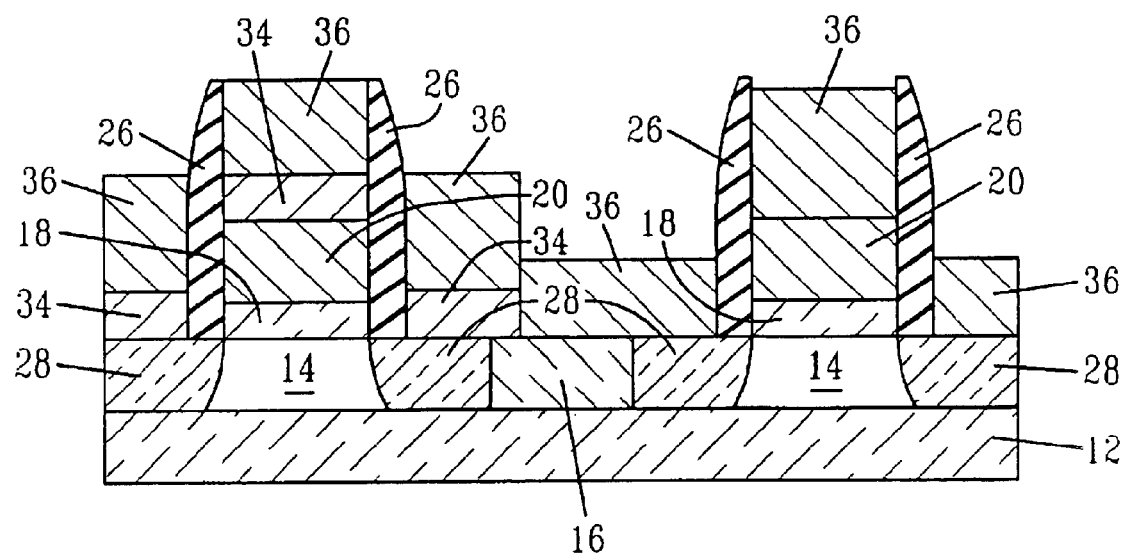

The resist is then patterned by lithography such that some of the patterned stack regions are left protected with resist 32, while other patterned stack regions are left unprotected. That is, a first predetermined number of patterned stack regions are exposed, while a second predetermined number of patterned stack regions are protected with resist 32. In FIG. 6, the patterned stack region 24' remains protected with resist 32, while patterned stack region 24 is left unprotected.

After patterning resist 32, oxide layer 22 is removed from the structure providing the structure shown, for example, in FIG. 6. Note that oxide layer 22 is removed to expose polysilicon layer 20. The removal step of the present invention is carried out by utilizing an etching process which is highly selective in removing barrier layer material and oxide as compared to silicon. The etching may be performed in a single step, or multiple etching steps may be performed, for removal of oxide layer 22.

A first metal 34 is then formed atop the exposed surfaces of polysilicon layer 20 utilizing a conventional deposition process including, but not limited to: sputtering, plating, CVD, atomic layer deposition or chemical solution deposition. The first metal is comprised of any metal that is capable of forming a metal silicide when in contact with silicon and subjected to annealing. Suitable first metals include, but are not limited to: Co, Ni, Ti, W, Mo, Ta and the like. Preferred first metals include: Ni, Co and Ti. The deposited first metal has a thickness of from about 10 to about 110 nm, with a thickness of from about 10 to about 85 nm being more highly preferred. The resultant structure, including first metal 34, is shown, for example, in FIG. 7.

After forming the first metal 34, resist 32 is removed from the structure utilizing a conventional resist stripping process well known to those skilled in the art so as to expose barrier layer 30 which was not previously removed from the structure. Note that in some embodiments of the present invention, resist 32 is only partially removed to expose some of the previously protected patterned stack regions, while still protecting some of the remaining patterned stack regions.

Oxide layer 22 is then removed utilizing the etching process mentioned above so as to expose polysilicon layer 20 of the previously protected region. Second metal 36, which has a different Fermi level than first metal 34, is then deposited on the first metal and the now exposed polysilicon layer 20. Suitable second metals include, but are not limited to: Co, Ni, Ti, W, Mo, Ta and the like, with the proviso that the second metal is different from the first metal. Preferred second metals include: Co, Ni and Ti. The deposited second metal has a thickness of from about 10 to about 110 nm, with a thickness of from about 10 to about 85 nm being more highly preferred. The resultant structure, including second metal 36, is shown, for example, in FIG. 8.

In some embodiments, the above procedures of resist removal and metal deposition may be repeated any number of times. In such an embodiment, each metal that is deposited has a different Fermi level than the previously deposited metal.

Next, the structure containing the first and second metals is subjected to an annealing step which is carried out under conditions that are effective in causing the first and second metals to react with the underlying silicon regions, i.e., the polysilicon layer, to form silicide regions 38 and 40, respectively. Silicide regions 38 is comprised of an alloy silicide of the first and second metals, whereas silicide region 40 is comprised of a silicide of the second metal. It is noted that the thickness of the first and second metals mentioned above is such that the reaction between the metals and the underlying portions of polysilicon layer 22 entirely consumes the polysilicon layer.

The annealing step is typically carried out at a temperature of from about 450° C. to about 900° C. for a time period of from about 15 to about 90 seconds. More preferably, the annealing step is typically performed at a temperature of from about 500° C. to about 700° C. for a time period of from about 20 to about 80 seconds. Note that other temperatures and times may be performed so long as the conditions are capable of causing the formation of silicide regions. The annealing step is typically carried out in a gas ambient that includes He, Ar, $N_2$ or a forming gas.

In some instances, not shown, some portions of the first and second metals are not used up in forming the silicide regions. In those embodiments, unreacted metal remains, and the unreacted metal is typically positioned atop the silicide regions. Unreacted metal is then removed providing the structure, shown, for example, in FIG. 9. Specifically, the unreacted metal, if present, is removed utilizing an etching process that is highly selective in removing metal as compared with silicide. For example, a mixture of hydrogen peroxide and sulfuric acid can be used in removing the remaining unreacted metal from the structure.

Figure 9:
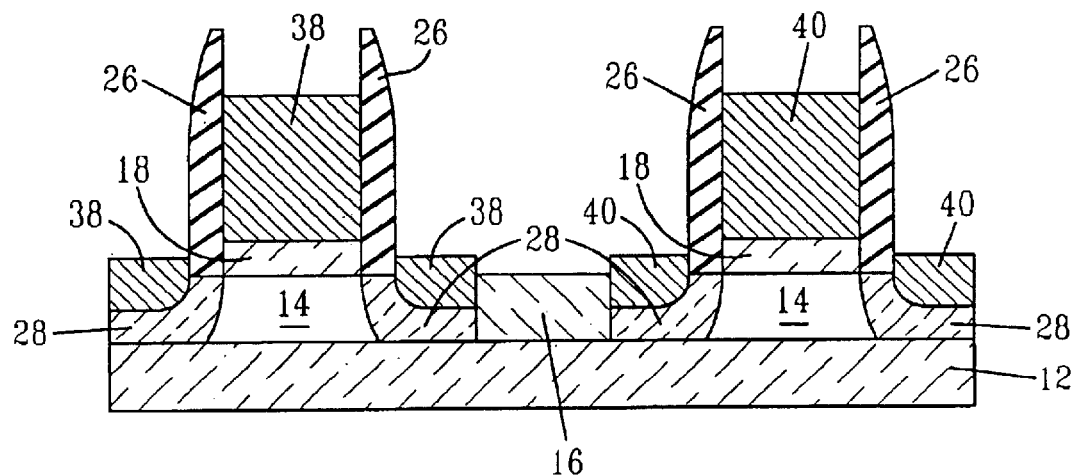
Figure 10A:
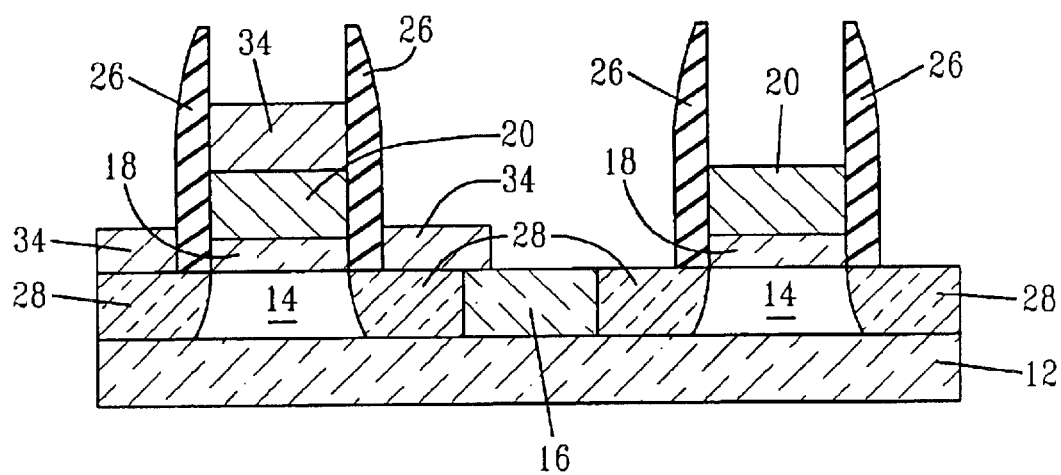
FIGS. 10A–10C are pictorial representations (through cross sectional views) showing the basic processing steps that are employed in an alternative processing scheme of the first method of the present invention.
Figure 10B:
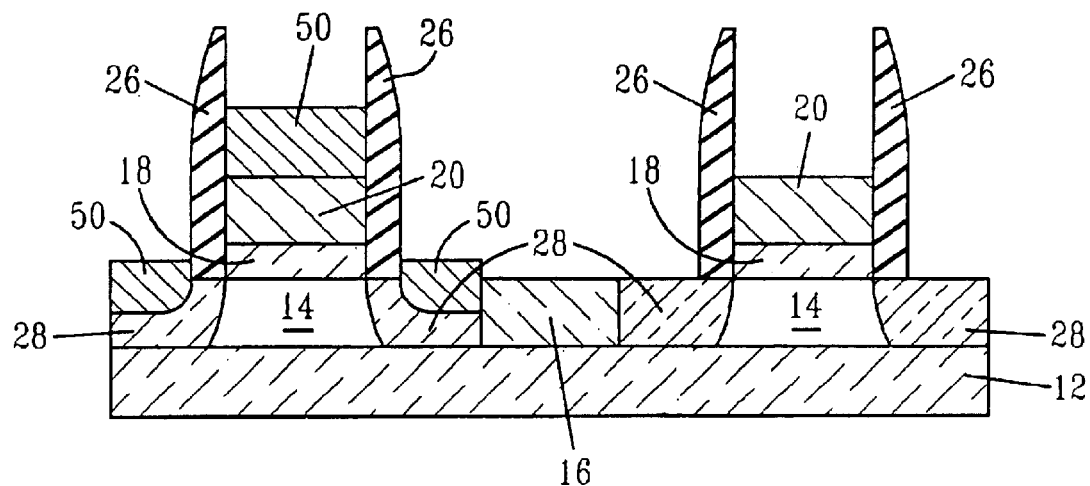
Figure 10C:
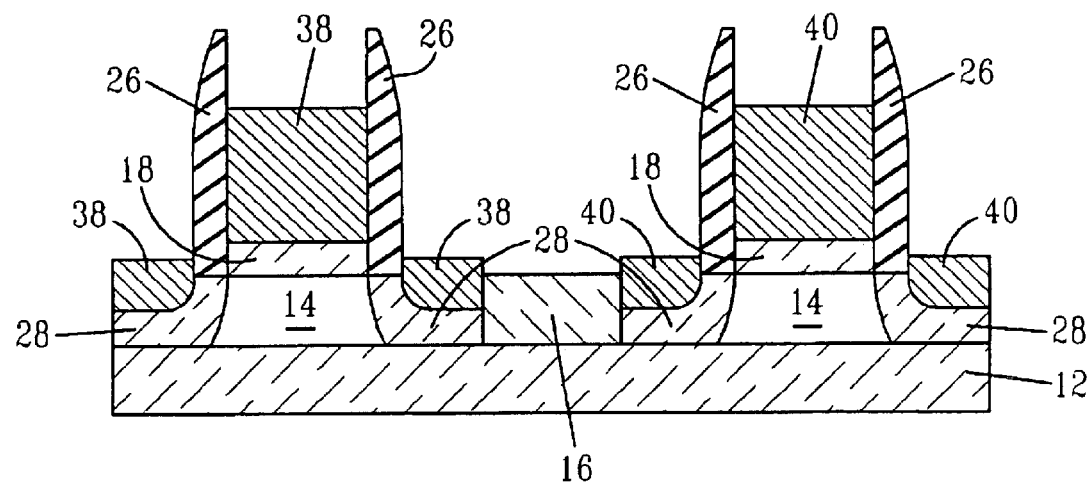

It is again noted that in the structure shown in FIG. 9 silicide region 38 is comprised of an alloy silicide of the first and second metals, while silicide region 40 is comprised of a silicide of the second metal. Hence, the resultant CMOS device has metal gate regions that have multiple-threshold voltages associated therewith. The threshold voltage of the CMOS device can be tuned by adjusting the ratio of first and second metals employed. The gates formed utilizing the method of the present invention are comprised entirely of a silicide; therefore the inventive method provides CMOS devices that do not exhibit any poly-depletion effects. The CMOS devices also have a lower gate resistance as compared to polySi gates and/or gates made from a stack of polySi/silicide.

In an alternative processing scheme of the first method of the present invention, the processing used in forming the structure shown in FIGS. 5–9 are replaced with the following scheme. First, oxide region 22 is removed from the structure shown in FIG. 4 and then first metal 34 is formed atop the exposed polysilicon layer 20. The first metal is then patterned via lithography and etching to provide the structure shown in FIG. 10A. After patterning, the first metal is subjected to annealing as described above to form a first metal silicide region 50 in the structure. The resultant structure including the first metal silicide region is shown, for example, in FIG. 10B. Note that if any unreacted first metal remains after annealing, the unreacted first metal may be removed as described above. Second metal 36 is then deposited and thereafter, the second metal is annealed. Note that if any unreacted second metal remains after annealing, the unreacted second metal may be removed as described above. The annealing forms silicide region 38 that is comprised of the first and second metals, as well as silicide region 40 that is comprised of the second metal. See FIG. 10C.

The alternative to the first method of the present invention provides CMOS devices that have metal gate regions that have multiple-threshold voltages associated therewith. The threshold voltage of the CMOS devices can be tuned be adjusting the ratio of first and second metals employed. The gates formed utilizing the method of the present invention are comprised entirely of a silicide; therefore the inventive method provides CMOS devices that do not exhibit any poly-depletion effects. The CMOS devices also have a lower gate resistance as compared to polySi gates and/or gates made from a stack of polySi/silicide.

The above description provides a method wherein a metal bilayer is employed in providing CMOS devices that have multiple-threshold voltages which can be tuned by simply varying the ratio of first and second metals used. The following description and FIGS. 11–16 illustrate the second method of the present invention wherein metal alloys are used in providing multiple-threshold gate regions which are tunable.

Figure 11:
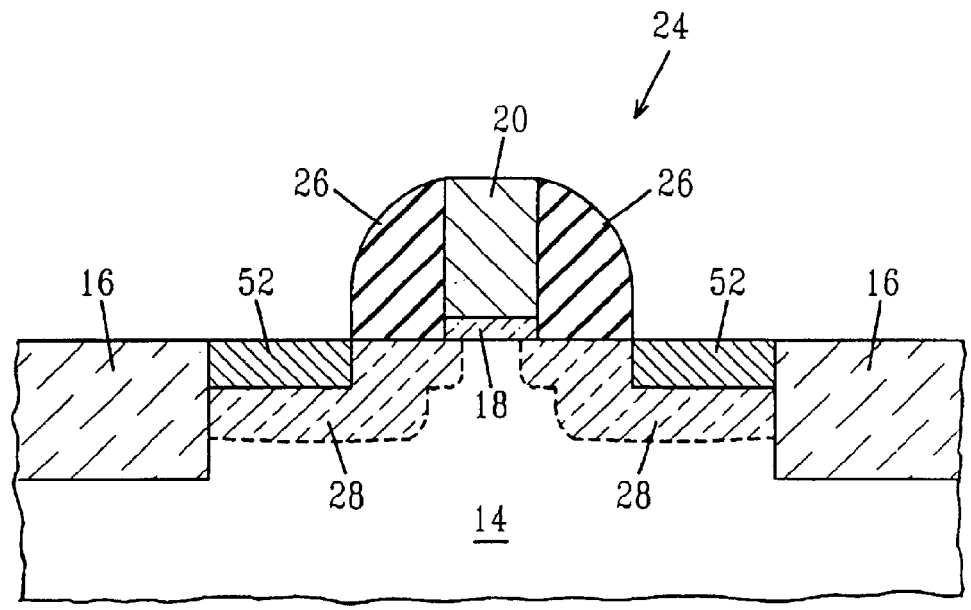
FIGS. 11–16 are pictorial representations (through cross sectional views) showing the basic processing steps that are employed in the second method of the present invention.
Figure 12:
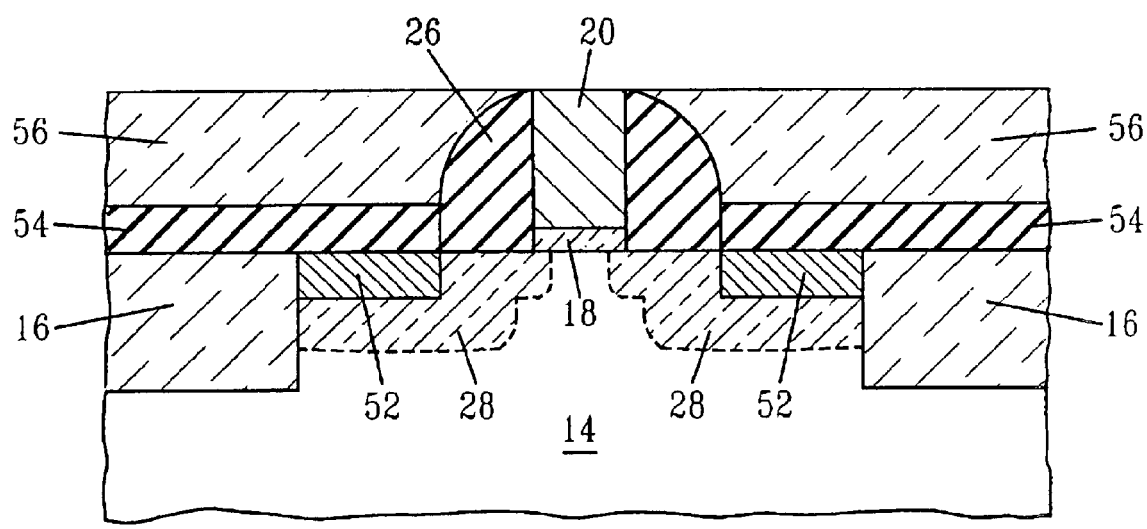

Reference is first made to the initial FET structure shown in FIG. 11. Specifically, the initial FET structure shown in FIG. 11 comprises Si-containing layer 14 having isolation trench regions 16 and source/drain regions 28 formed therein. The initial structure also includes at least one patterned gate stack 24 which comprises patterned gate dielectric 18 and patterned polysilicon gate 20 located atop a surface of the Si-containing layer. Insulating spacers 26 are located on opposing vertical sidewalls of the patterned gate stack region. The initial structure shown in FIG. 11 also includes silicide regions 52 which are located in the source/drain regions. Si-containing layer 14 may or may not be part of an SOI wafer. The Si-containing layer thus could be comprised of single crystal Si, poly-Si, SiGe, amorphous Si or an SOI wafer.

The structure shown in FIG. 11 is fabricated using conventional processing steps that are well known to those skilled in the art. Since the fabrication of the initial structure shown in FIG. 11 is well known a detailed description of the same is not provided herein. Any conventional CMOS device with a poly-Si gate can be used to form the alloy silicide gates.

A dielectric stack such as a layer of first dielectric and a second dielectric is then formed. Specifically, a layer of first dielectric 54 is then formed via a conventional deposition process or a thermal growing process on the structure shown in FIG. 11 so as to cover the exposed surface portions of Si-containing layer 14 and silicide regions 52. The first dielectric layer may be composed of a nitride or oxynitride, and it typically has a thickness of from about 10 to about 100 nm.

A second dielectric layer such as $SiO_2$ layer 56 is then formed by conventional techniques such as CVD atop dielectric layer 54. The second dielectric layer may be composed of a nitride or oxynitride, and it typically has a thickness of from about 10 to about 100 nm. Note that the top surface layer of layer 56 is coplanar with the top surface of polysilicon layer 20. To provide such coplanarity, a conventional planarization step such as chemical-mechanical polishing may follow the deposition of the $SiO_2$ layer. The resultant structure including dielectric layers 54 and 56 is shown, for example, in FIG. 12.

Figure 13:
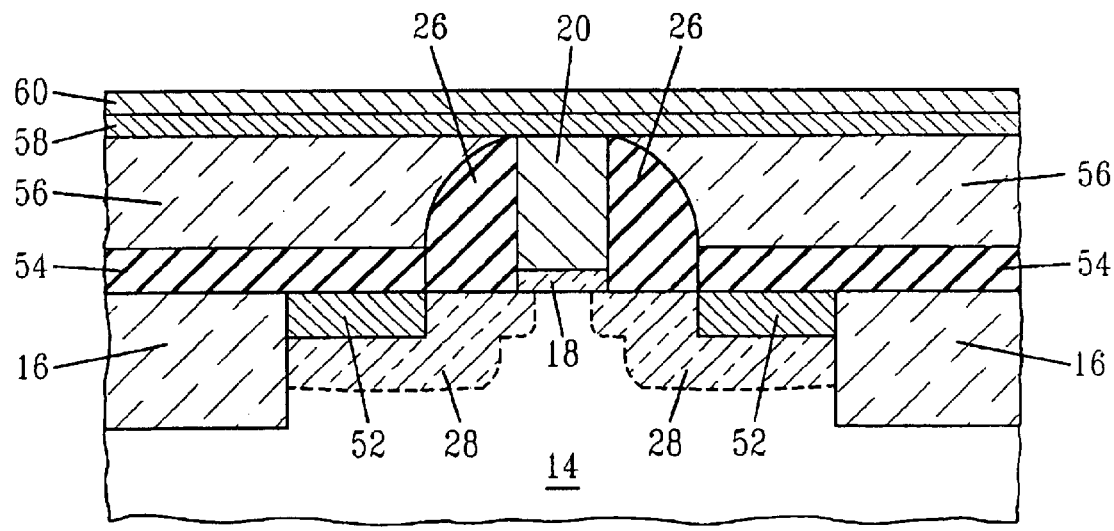
Figure 14:
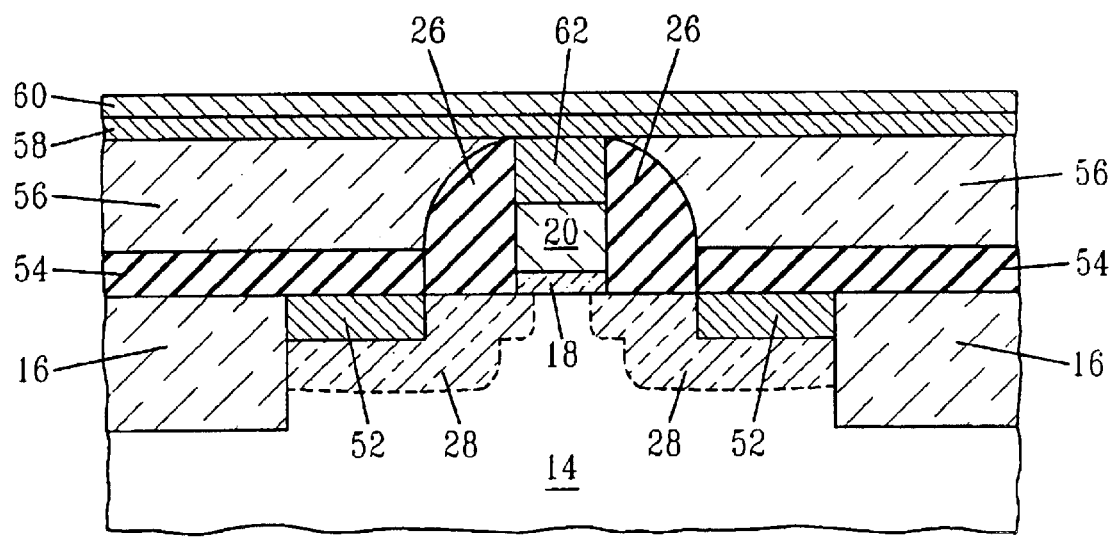

Metal alloy layer 58 is the formed atop layer 56 and the exposed polysilicon layer, See FIG. 13. The metal alloy layer of the present invention comprises at least one metal, which is capable of reacting with the underlying polysilicon to form a silicide region and an alloy additive. The metal of the metal alloy layer employed in the present invention includes any of the metals listed above in connection with the first and second metals. Preferred metals for the metal alloy are Co or Ni, with Co being highly preferred. The alloy layer of the present invention also include 0.1 to 50 atomic % of at least one additive, said at least one additive being selected from C, Al, Ti, V, Cr, Mn, Fe, Co, Ni, Cu, Ge, Zr, Nb, Mo, Ru, Rh, Pd, Ag, In, Sn, Hf, Ta, W, Re, Ir and Pt, with the proviso that the alloy additive is not the same as the metal. Mixtures of one or more of these additives are also contemplated herein. More preferably, the additive is present in the alloy layer in an amount of from about 0.1 to about 20 atomic %. Of the above mentioned additives, Al, Ti, V, Ge, Zr, Nb, Ru, Rh, Ag, In, Sn, Ta, Re, Ir, and Pt are preferred in the present invention.

The metal alloy layer may be deposited by physical vapor deposition (sputtering and evaporation), CVD including atomic layer deposition, or by plating. The metal alloy layer has a thickness of from about 10 to about 100 nm, with a thickness of from about 10 to about 85 nm being more preferred.

The term "alloy" is used herein to include metal compositions that have a uniform or non-uniform distribution of said additive therein; metal compositions having a gradient distribution of said additive therein; or mixtures and compounds thereof.

Next, as also shown in FIG. 13, a capping layer 60 is formed on the surface of metal alloy layer 58. The capping layer is formed using conventional deposition processes that are well known to those skilled in the art. Illustrative examples of suitable deposition processes that can be employed in the present invention in forming the capping layer include, but are not limited to: chemical vapor deposition, plasma-assisted chemical vapor deposition, sputtering, evaporation, plating, spin-on coating and other like deposition processes. The thickness of the capping layer is not critical to the present invention as long as the capping layer is capable of preventing oxygen or another ambient gas from diffusing into the structure. Typically, the capping layer has a thickness of from about 10 to about 30 nm.

The capping layer is composed of conventional materials that are well known in the art for preventing oxygen from diffusing into the structure. For example, TiN and W and other like material can be employed as the capping layer.

Next, the structure including the capping layer and the metal alloy layer is subjected to a first annealing step which is capable of causing partial interaction between the metal alloy layer and the underlying polysilicon layer. The first annealing step forms a partial silicide layer 62 in upper portions of the polysilicon layer, See FIG. 14. The silicide layer formed at this point of the present invention is a silicide material that is not in its lowest resistance phase. For example, when the metal alloy includes Co the first annealing step forms a CoSi in upper portions of the polysilicon layer.

The first annealing step is typically carried out at a temperature of from about 450° C. to about 600° C. for a time period of from about 1 to about 120 seconds. More preferably, the annealing step is typically performed at a temperature of from about 500° C. to about 550° C. for a time period of from about 20 to about 90 seconds. Note that other temperatures and times may be employed as long as the conditions are capable of causing the formation of silicide regions. The first annealing step is typically carried out in a gas ambient that includes He, Ar, $N_2$ or a forming gas.

Figure 15:
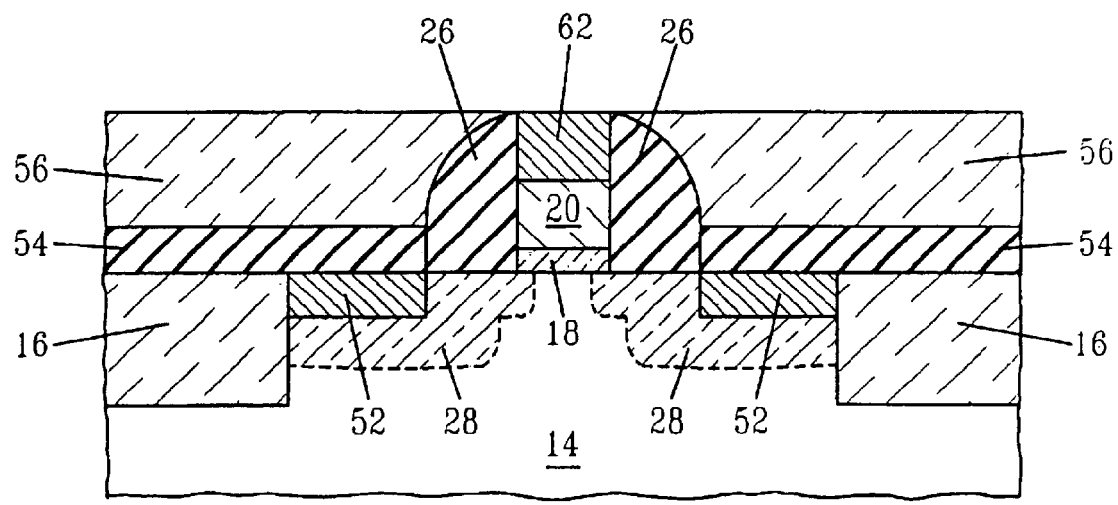
Figure 16:
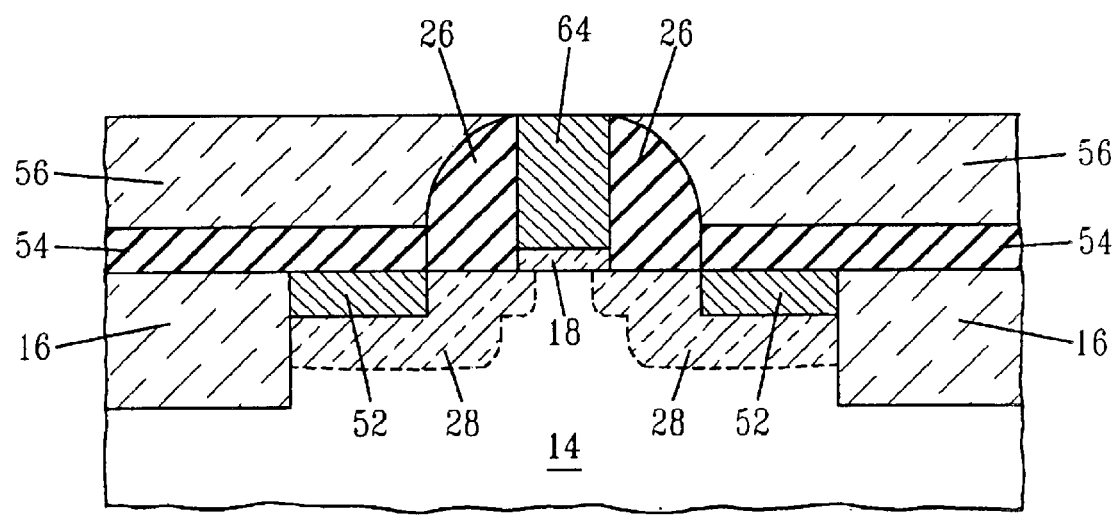

After the first annealing step, the capping layer and any unreacted metal alloy is removed from the structure utilizing a conventional etching process that is highly selective in removing both of the layers from the structure. The resultant structure which is formed after the selective removal process is shown, for example, in FIG. 15. Next, the structure shown in FIG. 15 is subjected to a second annealing step which converts the partial silicide/polysilicon region into a metal alloy silicide region. The resultant structure, including metal alloy silicide region 64, is shown, for example, in FIG. 16.

The second annealing step is typically carried out at a temperature of from about 600° C. to about 850° C. for a time period of from about 1 to about 60 seconds. More preferably, the annealing step is typically performed at a temperature of from about 650° to about 750° C. for a time period of from about 20 to about 45 seconds. Note that other temperatures and times may be employed so long as the conditions are capable of causing the formation of silicide regions. The annealing step is typically using a gas ambient that includes He, Ar, $N_2$ or a forming gas.

The resultant CMOS device has metal gate regions that have multiple-threshold voltages associated therewith. The threshold voltage of the CMOS device can be tuned by adjusting using the metal alloy layer. The gates formed utilizing this method of the present invention are comprised entirely of a silicide; therefore the inventive method provides CMOS devices that do not exhibit any poly-depletion effects. The CMOS devices also have a lower gate resistance as compared to polySi gates and/or gates made from a stack of polySi/silicide.

The following example is provided to illustrate some advantages that can be obtained using one of the methods of the present application. In particular, the following example illustrates the use of the second method of the present invention wherein a metal alloy layer is employed.

EXAMPLE

In this example, a Co alloy containing 5% Sn was compared to pure Co using the second method of the present invention. Specifically, a MOSFET structure including a patterned gate stack comprising 40 nm polysilicon gate and a 140 nm capping oxide layer was prepared. The patterned gate stack included 1.4 nm wide oxynitride spacers formed on opposing sidewalls thereof. The oxide capping layer was removed prior to activating the source/drain regions. The threshold voltage for NFET (263 nm gate width) poly-Si control device was 0.4V. When pure Co was used to form the $CoSi_2$, the threshold voltage value was 0.77 V. When Co containing 5 atomic % Sn was employed, the $CoSi_2(Sn)$ gate thus formed had a threshold voltage of about 1.02 V (a shift of about 250 mV toward the pFET direction). This example clearly demonstrates that the fully silicide metal alloy gate can effectively adjust the threshold voltage of a MOSFET.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described, but fall with the scope of the appended claims.

Having thus described our invention in detail, what we claim as new and desire to secure by the Letters Patent is:

1. A method of forming a metal-gated CMOS device comprising the steps of:
   providing a structure which comprises a plurality of patterned gate regions located atop a Si-containing layer, each of said patterned gate regions including at least a patterned polysilicon region;
   forming a first metal on each of a first predetermined number of said patterned gate regions, said first metal is in contact with said patterned polysilicon region of each of said first predetermined number of said patterned gate regions;
   forming a second metal on said first metal as well as each of a second predetermined number of said patterned gate regions, wherein said second metal in each of said second predetermined number of said patterned gate region is in contact with said patterned polysilicon region of each of said second predetermined number of said patterned gate regions; and
   annealing so as to cause reaction between the first and second metals and underlying patterned polysilicon regions and subsequent formation of silicide regions, where each of said first predetermined number of patterned gate regions comprises an alloy silicide of the first and second metals and each of said second predetermined number of patterned gate regions comprises a silicide of said second metal.

2. The method of claim 1 wherein said first metal and said second metal have different Fermi levels.

3. The method of claim 2 wherein said first metal comprises Co, Ni, Ti, W, Mo or Ta.

4. The method of claim 2 wherein said second metal comprises Co, Ni, Ti, W, Mo, or Ta.

5. The method of claim 1 wherein said first metal is Co and said second metal is Ni.

6. The method of claim 1 wherein said annealing is performed at a temperature of from about 450° C. to about 900° C. for a time period of from about 15 to about 90 seconds.

7. The method of claim 1 wherein said annealing is performed in He, Ar, $N_2$ or a forming gas.

8. A method of forming a metal-gated CMOS device comprising the steps of:
   providing a structure which comprises a plurality of patterned gate regions located atop a Si-containing layer, each of said patterned gate regions including at least a patterned polysilicon region;
   forming a first metal on each of a first predetermined number of said patterned gate regions, said first metal is in contact with each at said patterned polysilicon region of each of said first predetermined number of said patterned gate regions;
   first annealing said first metal to provide a first metal silicide in each of said first predetermined number of said patterned gate regions;
   forming a second metal atop the first metal silicide as well as on each of a second predetermined number of patterned gate regions, said second metal in each of said second predetermined number of patterned gate regions is in contact with said patterned polysilicon region of each of said second predetermined number of said patterned gate regions; and
   second annealing said second metal to form a second metal silicide region, wherein each of said first predetermined number of patterned gate regions comprises at least an alloy silicide of said first and second metals, and each of said second predetermined number of patterned gate regions comprises said second metal silicide region.

9. The method of claim 8 wherein said first metal and said second metal have different Fermi levels.

10. The method of claim 9 wherein said first metal comprises Co, Ni, Ti, W, Mo or Ta.

11. The method of claim 9 wherein said second metal comprises Co, Ni, Ti, W, Mo, or Ta.

12. The method of claim 8 wherein said first metal is Co and said second metal is Ni.

13. The method of claim 8 wherein said first annealing is performed at a temperature of from about 450° C. to about 600° C. for a time period of from about 1 to about 120 seconds.

14. The method of claim 8 wherein said first annealing is performed in He, Ar, $N_2$ or a forming gas.

15. The method of claim 8 wherein said second annealing is performed at a temperature of from about 600° C. to about 850° C. for a time period of from about 1 to about 60 seconds.

16. The method of claim 8 wherein said second annealing is performed in He, Ar, $N_2$ or a forming gas.

17. A method of forming a metal-gated CMOS device comprising the steps of:
   providing a structure which comprises a plurality of patterned gate regions located atop a Si-containing layer, each of said patterned gate regions including at least a patterned polysilicon region;
   forming a dielectric stack on exposed surfaces of said Si-containing layer, said dielectric stack having an upper surface that is coplanar with said patterned polysilicon region of each of said patterned gate regions;
   forming a metal alloy layer atop said upper surface of said dielectric stack and an exposed surface of said patterned polysilicon region of each of said patterned gate regions, said metal alloy layer comprising a metal and at least one alloying additive;
   forming a capping layer atop said metal alloy layer;
   first annealing to form a partial silicide region in an upper portion of each of said patterned gate regions;
   selectively removing said capping layer; and
   second annealing to convert a remaining portion of each of said patterned gate regions and said partial silicide region of each of said patterned gate regions into a metal alloy silicide region.

18. The method of claim 17 wherein said metal alloy layer comprises a metal and an alloying additive.

19. The method of claim 18 wherein said metal of said metal alloy layer comprises Co, Ni, Ti, W, Mo or Ta.

20. The method of claim 18 wherein said alloying additive comprises C, Al, Ti, V, Cr, Mn, Fe, Co, Ni, Cu, Ge, Zr, Nb, Mo, Ru, Rh, Pd, Ag, In, Sn, Hf, Ta, W, Re, Ir, Pt, or mixtures thereof, with the proviso that the alloy additive is not the same as the metal.

21. The method of claim 20 wherein said alloying additive comprises Al, Ti, V, Ge, Zr, Nb, Ru, Rh, Ag, In, Sn, Ta, Re, Ir, or Pt.

22. The method of claim 18 wherein said metal alloy layer contains from about 0.1 to about 50 atomic % of said alloying additive.

23. The method of claim 17 wherein said first annealing is performed at a temperature of from about 450° C. to about 600° C. for a time period of from about 1 to about 120 seconds.

24. The method of claim 17 wherein said first annealing is performed in He, Ar, $N_2$ or a forming gas.

25. The method of claim 17 wherein said second annealing is performed at a temperature of from about 600° C. to about 850° C. for a time period of from about 1 to about 60 seconds.

26. The method of claim 17 wherein said second annealing is performed in He, Ar, $N_2$ or a forming gas.

27. The method of claim 17 wherein said metal alloy comprises Co with Sn.

* * * * *